United States Patent [19]
Iyer

[11] Patent Number: 5,946,542
[45] Date of Patent: Aug. 31, 1999

[54] METHOD OF DEPOSITING PASSIVATION LAYERS ON SEMICONDUCTOR DEVICE ARRAYS

[75] Inventor: Ravi Iyer, Boise, Id.

[73] Assignee: Micron Technology, Inc., Boise, Id.

[21] Appl. No.: 08/605,524

[22] Filed: Feb. 26, 1996

[51] Int. Cl.$^6$ ................................................ H01L 21/316
[52] U.S. Cl. ............................................. 438/7; 437/786
[58] Field of Search ........................................ 438/786, 7

[56] References Cited

U.S. PATENT DOCUMENTS

| | | | |
|---|---|---|---|
| 4,196,233 | 4/1980 | Bitzer et al. | 427/249 |
| 4,702,936 | 10/1987 | Maeda et al. | 438/786 |
| 5,032,233 | 7/1991 | Yu et al. . | |
| 5,066,611 | 11/1991 | Yu . | |
| 5,081,632 | 1/1992 | Magita et al. | 372/45 |
| 5,094,712 | 3/1992 | Becker et al. . | |
| 5,217,926 | 6/1993 | Langley . | |
| 5,277,715 | 1/1994 | Cathey . | |
| 5,302,233 | 4/1994 | Kim et al. . | |
| 5,320,880 | 6/1994 | Sandhu et al. . | |
| 5,354,575 | 10/1994 | Dagenais et al. | 427/10 |
| 5,362,686 | 11/1994 | Harada | 438/786 |
| 5,365,104 | 11/1994 | Godinho et al. | 257/529 |
| 5,416,048 | 5/1995 | Blalock et al. . | |
| 5,455,453 | 10/1995 | Harada et al. | 257/675 |
| 5,587,344 | 12/1996 | Ishikawa | 438/786 |
| 5,643,834 | 7/1997 | Harada et al. | 437/210 |

FOREIGN PATENT DOCUMENTS 2218131   8/1990   Japan .

OTHER PUBLICATIONS

W.A.P. Claassen et al., "Characterization of Silicon–Oxynitride Films Deposited by Plasma–Enhanced CVD," J. Electrochem. Soc., Jul. 1986, pp. 1458–1464.

H. Dun et al., "Mechanisms of Plasma–Enhanced Silicon Nitride Deposition Using $SiH_4/N_2$ Mixture," J. Electrochem. Soc., Jul. 1981, pp. 1555–1563.

W. R. Knolle et al., "Characterization of Oxygen–Doped, Plasma–Deposited Silicon," J. Electrochem. Soc., May 1988, pp. 1211–1217.

S. Sze, "VLSI Technology," 2nd Ed., McGraw Hill Co., New York, p. 266.

S. Sze, "VLSI Technology," 2nd Ed., McGraw Hill Co., New York, p. 417.

S. Wolf, "Silicon Processing for the VLSI Era," vol. 2, Lattice Press, Sunset Beach, CA, pp. 273–276.

N.L.S. Yamasaki et al., "Microwave and RF PECVD of SiOx and SiOxNy Thin Films," Proceedings of the SPIE, Conference Paper Optical Thin Films IV: New Developments, San Diego, CA, Jul. 25–27, 1994.

*Primary Examiner*—Charles Bowers
*Assistant Examiner*—Matthew Whipple
*Attorney, Agent, or Firm*—Knobbe, Martens, Olson & Bear, LLP

[57] ABSTRACT

A method of forming a silicon oxynitride ($SiO_xN_y$) passivation layer on a first side of a silicon wafer that has a plurality of parallel spaced conductive runners positioned thereon. The method comprises the steps of mixing TEOS, Oxygen, Nitrogen and either Ammonia or Diethyl amine and then introducing the mixture into a plasma deposition chamber containing the wafers that are to receive the passivation layer. The mixture is then energized into a plasma which results in a silicon oxynitride passivation layer being deposited onto the upper surface of the silicon wafer. Due to the characteristics of the TEOS gas, the passivation layer is very conformal which reduces the formation of keyholes in the passivation layer.

21 Claims, 3 Drawing Sheets

METHOD OF DEPOSITING PASSIVATION LAYERS ON SEMICONDUCTOR DEVICE ARRAYS

BACKGROUND OF THE INVENTION

1. Field of the Invention

This invention generally relates to semiconductor integrated device design and fabrication and, more particularly, to techniques for forming protective passivation layers on top of VLSI or ULSI arrays.

2. Description of the Related Art

Despite the astonishingly rapid pace of development in semiconductor integrated circuit technology, there is yet an ever increasing demand for higher circuit densities. Hence, there is a co-existent need for manufacturing technologies which can achieve these higher circuit densities. This has led to the development of Ultra Large Scale Integration (ULSI) manufacturing techniques. To accommodate the need for higher circuit densities, the predominance of Ultra Large Scale Integration technologies for integrated circuit production seems assured for the foreseeable future.

As silicon technology advances to ULSI, the devices on silicon wafers shrink to sub-micron dimensions and the circuit density increases to several million transistors per chip. In order to accomplish this high device packing density, smaller and smaller feature sizes are required. This may include the geometry of various features and the width and spacing of the interconnecting lines.

However, the manufacture of such small size devices require newer materials, better deposition techniques and improved patterning techniques. This is particularly true for integrated circuit memories which are the most densely packed integrated circuits commonly manufactured. In such device designs, one of the last layers put on the wafer is a final conductor metal layer to provide interconnections within the chip circuitry and to connect the chip circuitry to external devices through the bonding pads. Typically, this metal layer is patterned to form an array of substantially parallel conductive runners which are spaced a defined distance apart relative to adjacent runners throughout the array. Additionally, the patterned metal runners have a significant height throughout the array.

Following the patterning of this final metal layer, a passivation layer is deposited over the entire top surface of the wafer. The passivation layer is an insulating and protective layer which prevents mechanical and chemical damage during the assembly and packaging. The passivation layer will be finally masked and etched to define patterns corresponding to the bonding regions in which electrical contact to the finished circuit is to be made.

There is a variety of requirements which a material must satisfy when used as a passivation layer for underlying circuit structures. For example, the passivation layer should be impermeable to moisture and sodium atoms, and other highly mobile impurities, e.g., form a diffusion barrier against these impurities. It should adhere well to the conductive metal runners as well as to the dielectric layer circuits while having high thickness uniformity and high conformal step coverage, i.e., cover the various levels of the substrate evenly. It should be possible to pattern the passivation layer with conventional photolithography techniques. Finally, the passivation layer should exhibit low stress and must have similar expansion-contraction thermal properties with the neighboring materials.

Although various dielectric materials have been used as passivation layers, no single material could ideally satisfy all these requirements. Therefore, according to current industry practices, passivation layers comprising a plurality of different dielectric layers are generally preferred. Such combinations of different dielectrics result in passivation layers having the properties of those dielectric materials used together, thereby improving the efficiency of the passivation layer. Nevertheless, a single layer of material could also be used to form a passivation layer if it satisfies the requirements for that specific purpose. The most widely used materials as passivation layers comprise silicon dioxide ($SiO_2$), phosphorus-doped $SiO_2$ (phosphosilicate glass or PSG), boron/phosphorus-doped $SiO_2$ (borophosphosilicate glass or BPSG), spin on glass (SOG), silicon nitride, silicon oxinitride and combinations thereof.

Recently, among other materials, much effort has been focussed on silicon oxinitride films to form such passivation layers for ULSI technology. Typically, silicon oxinitride ($SiO_xN_y$, oxinitride) passivation films provide an impermeable barrier to moisture and mobile impurities (e.g., sodium). Further, these films also form a tough coat with good conformality, high cracking resistance and low intrinsic stress. In fact, these properties make oxinitrides superior to other known passivation dielectrics.

Of the many methods available for depositing thin films, plasma enhanced chemical vapor deposition techniques are most preferred to deposit oxinitride layers. Plasma deposited oxinitrides form at the temperature range between 300 and 400° C. and this low temperature range allows it to be used over aluminum metalization layers as the melting point of aluminum is 660° C. Other potential advantages of the plasma deposition techniques are the precise control of composition and structure, uniform layer thickness, fast deposition rates, high throughput and low processing costs.

During the plasma deposition, in a plasma reactor, silane ($SiH_4$) reacts with a mixture of ammonia ($NH_3$), nitrogen ($N_2$) and oxygen ($O_2$) in a plasma maintained by RF power. The resulting silicon oxinitride is non-stoichiometric and the composition and the properties of it depend on the reactant ratios and the ionizing RF power.

However, as device dimensions become smaller and the spacing between adjacent runners becomes closer, the current silane based oxinitride deposition technique fails to provide defect free and conformal passivation layers. This situation is illustrated with reference to FIG. 1A which illustrates a substrate 100 having a plurality of conductive metal runners 101 formed on top of the substrate 100. A thin conformal layer of interlevel dielectric 102, e.g., silicon dioxide, isolates the conductor runners 101 and forms a smooth base for the overlying passivation layer 103. A silicon oxinitride passivation layer 103 is conformally deposited over the steps comprising the isolated conductor runners 104 and into the gaps 105 between the runners 104. As the deposition process cannot provide conformality, however, the thickness of the passivation layer at the top of the step 106 exceeds that on the bottom 107 and on the side walls 108 of the steps. As a result, the passivation layer on the top of the step 106 bulges outwardly. This phenomenon is know as "cusping" or "breadloafing". The cusping effectively closes the mouth of the gap 109 between the adjacent runners 101 and produces a series of unwanted voids 110, i.e., keyholes 110, as shown in FIG. 1B. These keyholes 110 can trap moisture and reactive gases which can lead to accelerated degradation of device lifetime. In addition, they may cause stress cracks and out gassing problems during subsequent processing steps (by opening up and releasing the trapped gas or moisture).

As device dimensions get smaller and interconnecting metal runners are placed closer and closer together, the problem of "keyhole" formation becomes even greater for prior art semiconductor devices having passivation layers formed in the known manners. As is apparent, there is a need in current semiconductor technology for improved methods to deposit passivating silicon oxinitride layers. Such improved deposition processes can allow a more conformal deposition of silicon oxinitride so that cusping of the passivation layer on the interconnecting runners is minimized and consequently void formation is significantly reduced.

SUMMARY OF THE INVENTION

The aforementioned needs are satisfied by the method of depositing a passivation layer of the present invention. The method is preferably comprised of reacting a mixture of gasses that contain silicon, oxygen and nitrogen to form a plasma so that a very conformal passivation layer is formed on a silicon wafer that has been exposed to the plasma.

In one preferred embodiment, TEOS gas, Oxygen gas, Nitrogen gas, and either Ammonia gas or Diethyl amine gas are all mixed together to form a mixture and the mixture is then introduced into a plasma deposition chamber containing the wafer. The plasma deposition chamber is then energized so that the mixture of gasses forms a plasma. As a result of being exposed to the plasma, a silicon oxynitride passivation layer is formed on the wafer. This silicon oxynitride passivation layer is preferably conformal so that keyholes in the passivation layer are minimized. Specifically, for each conductive runner, the passivation layer at the interface between the side wall and the top surface of the conductive runner is separated from the passivation layer at the interface between the side wall and the top surface of the next adjacent conductive runner. In this manner, keyhole formation is minimized.

In another aspect of the invention, the refractive index of the passivation layer is being measured while the layer is being deposited. The gasses forming the mixture are then adjusted so that the refractive index of the passivation layer is maintained at a desired index of refraction.

The methods of the preferred embodiments result in a very conformal passivation layer being formed on the semiconductor wafer. The problems with keyhole formation that result from silane based passivation layer deposition methods are thereby reduced. Further, since, in the preferred embodiment, TEOS is used in the place of silane, various environmental concerns are alleviated. These and other objects and features of the present invention will become more fully apparent from the following description taken in conjunction with the accompanying drawings.

DETAILED DESCRIPTION OF THE PREFERRED EMBODIMENTS

Reference will now be made to the drawings wherein like numerals refer to like parts throughout. In accordance with the principles of the present invention, high conformality layers of silicon oxinitride can be provided by using the tetraethyl orthosilicate (TEOS) based plasma enhanced deposition technique of the preferred embodiment.

Figure 2A:
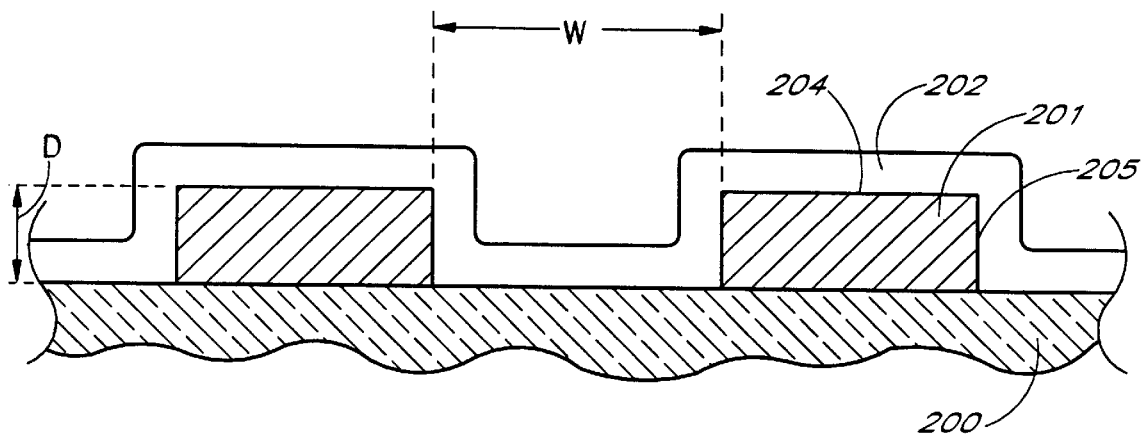
FIG. 2A is a schematic section of a wafer having an interlevel dielectric layer deposited on a plurality of conductive runners.
Figure 2B:
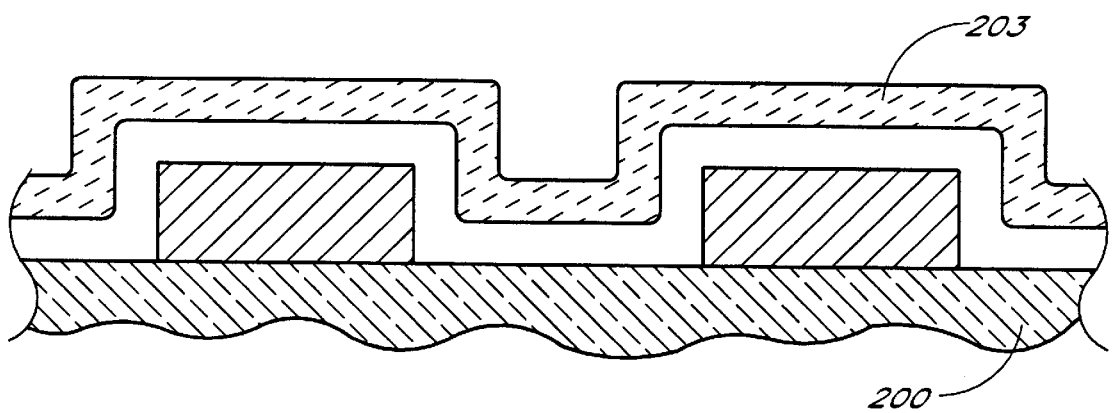
FIG. 2B is a schematic view of the wafer shown in FIG. 2A wherein a passivation layer has been deposited on top of the interlevel dielectric layer in accordance with the preferred embodiment.

FIG. 2A illustrates a wafer fragment comprising a semiconductor substrate 200 and a plurality or array of parallel spaced conductive runners 201 formed atop the substrate 200. Typically, devices are formed in the semiconductor substrate 200 and contacts are formed in the conductive runners 201 which provide contact to the devices. As is understood in the art, the typical DRAM memory has two sets of a plurality of parallel spaced conductive runners that are perpendicular to each other and intersect each other at locations adjacent to the contacts connected to the underlying memory cells. To achieve larger memory arrays, the cells are positioned closer together which results in the parallel conductive runners 201 being positioned closer together.

An interlevel insulating layer 202 may be applied over the wafer to form a base for the passivation layer 203 and to enhance the conformality of the passivation layer. Typically, the conducting runners 201 are formed of aluminum or another conductive metal such as copper or gold. The conductive aluminum layers are deposited and patterned by techniques that are well known in the art. Further, the conducting runners 201 include a top surface 204 and vertical parallel sidewalls 205. Such runners 203 have a defined height "D" and are spaced relative to one another a defined distance "W" throughout the array of conductive runners 201.

The interlevel isolation layer 202 may comprise a dielectric material such as silicon dioxide ($SiO_2$) and be deposited over the array of runners 201 to a selected thickness range which is typically equal to approximately 50% of the runner height (0.5×D). A silicon dioxide interlevel layer 202 can be deposited by a variety of processes well known in the art such as TEOS based chemical vapor deposition techniques. As previously mentioned, this interlevel dielectric layer 202 uniformly covers the conductive runners 201 and the distance W between the conductive runners 207 with a continuous film having the preferred thickness.

Figure 1A:
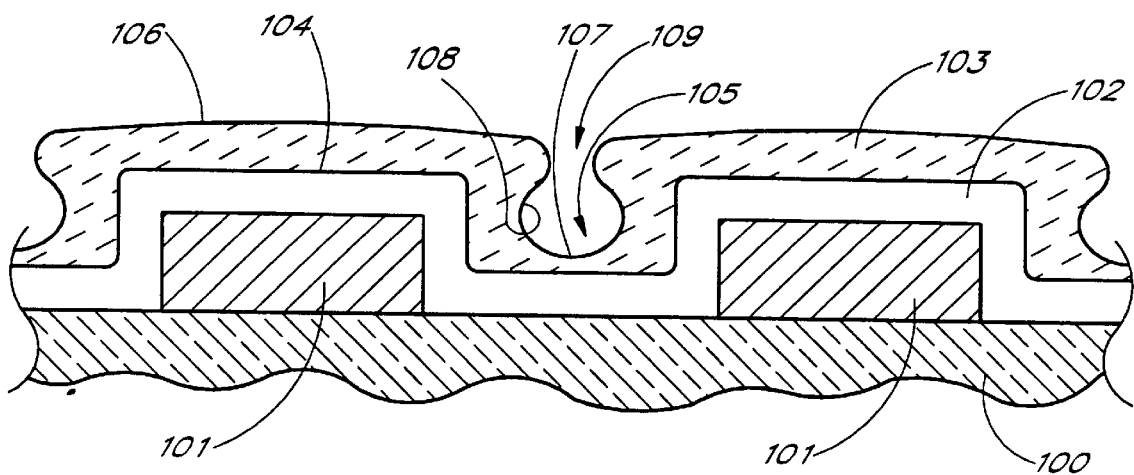
FIG. 1A is a schematic section of a wafer illustrating a prior art deposition process to form a passivation layer over an interlevel dielectric deposited on top of a plurality of conductive runners.
Figure 1B:
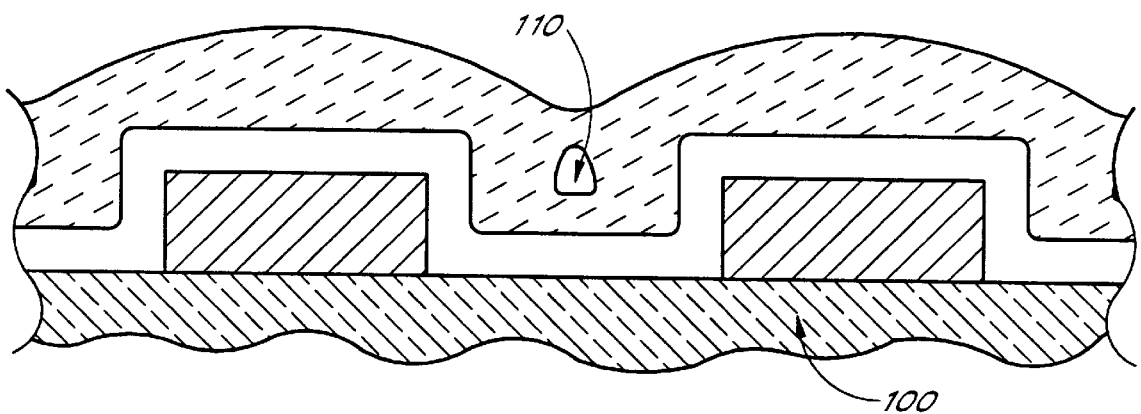
FIG. 1B is a schematic view of the wafer shown in FIG 1A wherein a keyhole has been formed in the deposited passivation layer.

As illustrated in FIG. 1B, in accordance with the principles of the present invention, following the deposition of interlevel dielectric layer 202, a passivation layer preferably comprised of a layer of silicon oxinitride ($SiO_xN_y$) 203 is then formed on top of the interlevel layer 202 using a unique silicon oxinitride deposition method. Specifically, in this embodiment, a TEOS based PECVD process is used to form very conformal and defect-free passivation layers 203 on the interlevel dielectric layer. This represents a significant departure from prior art silane based deposition techniques and, as will be understood from the following description, this results in a very conformal and defect-free passivation layer that is suitable for UCSI applications. In the preferred embodiment, a plasma deposited silicon oxinitride 203 is formed by reacting TEOS with oxygen ($O_2$), ammonia ($NH_3$), nitrogen ($N_2$) in a plasma discharge.

Figure 3:
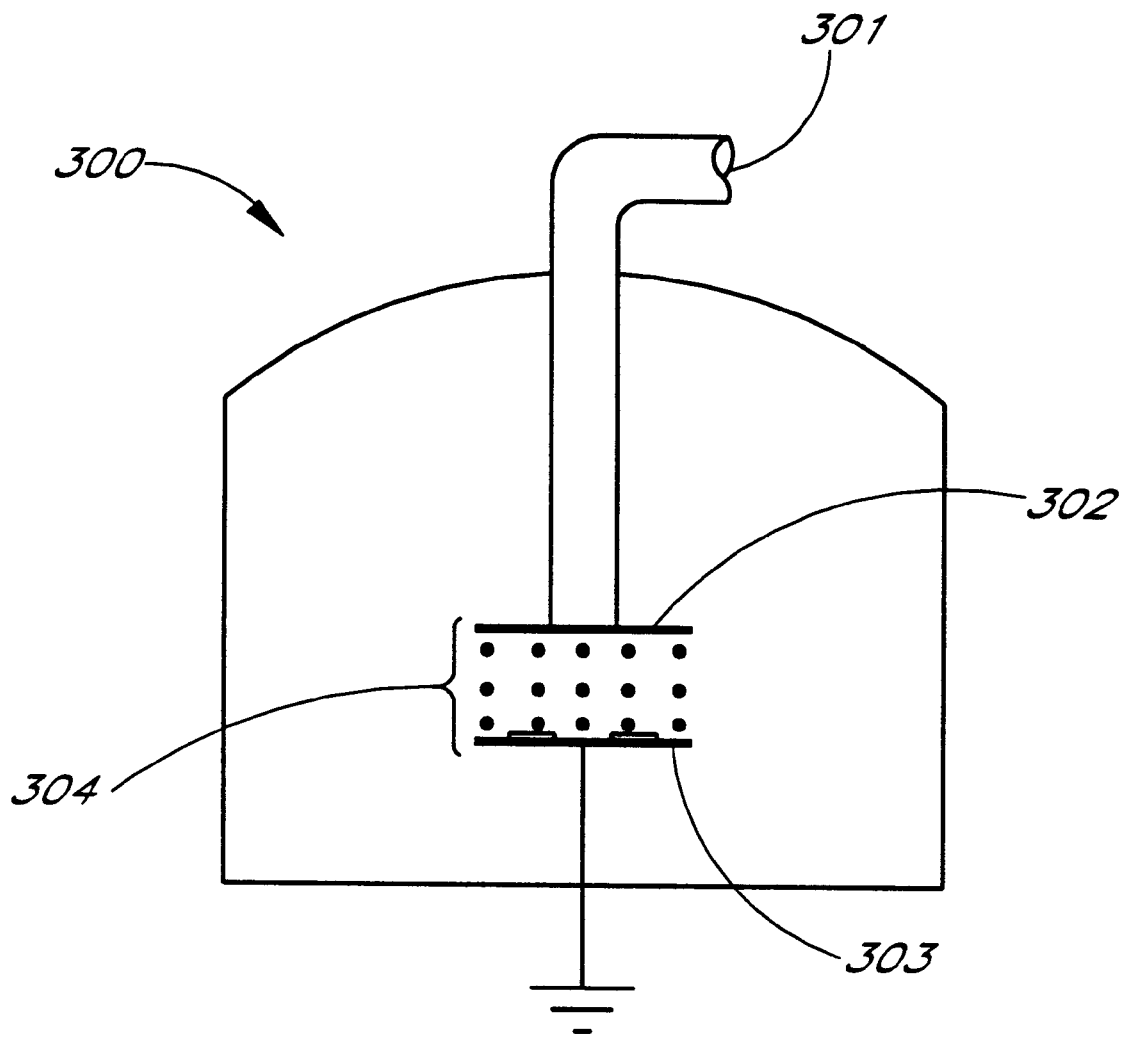
FIG. 3A is an exemplary representation of a parallel plate PECVD reactor.

A preferred silicon oxinitride deposition process may, for example, be accomplished in a parallel plate plasma enhanced chemical vapor deposition reactor 300 such as the reactor schematically illustrated in FIG. 3. In particular, a silicon oxinitride deposition can be carried out, in accordance with the present invention, by utilizing an Applied Materials Model 5000 reactor available from Applied Materials Inc. of Santa Clara, Calif. This reactor is a parallel plate showerhead system with a reactor chamber that has a 5,600 cc inner volume and the reactor is RF (radio frequency) powered. The preferred general process parameters used during the silicon oxinitride plasma deposition are as follows:

| | |
|---|---|
| TEOS flow | 100–5000 sccm |
| $O_2$ flow | 25–1000 sccm |
| $NH_3$ flow | 25–1000 sccm |
| $N_2$ flow | 500–5000 sccm |
| RF power | 100–1000 watts |
| Pressure | 3–9 Torrs |
| Temperature | 200–600° C. |

As shown in FIG. 3, the vacuum chamber 300 includes a reactor chamber 305 that has a flow line 301 which carries gas into the chamber. The flow line 301 is connected to a showerhead 302 which is energized to form an upper electrode in the plasma chamber. A wafer holder 303 is positioned at a spaced distance from the upper electrode/showerhead 302 and the wafer holder 303 is energized so as to form a lower electrode in the plasma chamber. The electrodes are energized when the gas mixture of the preferred embodiment is introduced into the reactor chamber 305 so that the gas mixture is energized into a plasma state between the upper and lower electrodes.

Specifically, during the process of the preferred embodiment, reactant gases of $Si(OC_2H_5)_4$ (TEOS), $O_2$, $NH_3$ and $N_2$ are premixed in the flow line 301 and are then injected through the showerhead (upper electrode) 302 into the reactor chamber 305 in a manner that results in a uniform flow pattern out of the showerhead. In the process of the preferred embodiment, it would be appreciated that the reactant gas ammonia ($NH_3$) can be replaced with an organic amine gas such as Diethyl amine gas. The RF field energizes the gas mixture to a plasma state which exhibits itself as a glow discharge 304 generated between the showerhead 302 and the wafer holder (lower electrode) 303.

In general, the plasma comprises mobile positively and negatively charged particles. These particles interact because of the attractive or repulsive forces resulting from the electric field surrounding each charged particle, i.e., Coulombic forces. Plasma particle species include neutral atoms, electrons and ions. Typically, the density of opposite charges in gaseous plasma is equal and thus the plasma is electrically neutral. The reacting gases injected through the showerhead 302 are thus ionized and dissociated by electron impact. These ions then combine on the surface of the wafer as the deposition compound silicon oxinitride to form the passivation layer 203.

Due to its non-stoichiometric nature, the chemical formula $SiO_xN_y$ may be used to designate the composition of the resulting passivate film 203. In general, passivation films deposited using the above-described process experience very low cusping when deposited, i.e., the horizontal growth of the passivation layer at the interface between the side walls 205 and the upper surface 204 of each of the conductive runners 201 is minimized. Hence, higher conformality of the passivation layer 203 to the contours of the array of conductive runners 203 as compared to the films 103 deposited with prior art processes (See, e.g., FIGS. 1A and 1B) is achieved. In the preferred embodiment, this may be attributed to the organic character of the TEOS compound, because silicon ions from organic silicon compounds, such as TEOS, have higher surface mobility during the chemical vapor deposition (CVD) process described above, i.e., they spread over a larger area when exposed to the RF power in the reactor chamber 305. As a result of the silicon being more widely distributed, the silicon oxinitride compound may form and grow evenly into a layer with less local variations in the thickness of the layer which results in a more uniform step coverage. It will be appreciated that, as a result of the more uniform coverage and reduced cusping, keyhole formation (See, FIG. 1B) is reduced.

In one preferred process, the silicon oxinitride deposition rate is typically 1,000 to 10,000 Å per minute and a preferred thickness range for this passivation layer 203 would be from 4,000 to 6,000 Å. In general, the composition and the properties of the silicon oxinitride layer 203 depend on the relative ratios of the TEOS and the other reactants. Using known automatic elliposmetry devices and techniques to measure the refractive index while the passivation layer 203 is being deposited, the characteristics of the layer 203 can be controlled by varying reactant ratios. For example, the refractive index of the silicon oxinitride (1.7 to 2.0) and the density (2.2 to 3.0 g/cm³) decreases as the oxygen concentration in the film 203 increases. The refractive index and, thus, the density of the film can be adjusted by varying $(NH_3+N_2)/O_2$ ratio for a constant TEOS flow. It will be appreciated that a silicon oxinitride passivation layer 203 with lower refractive index enables the use of a laser beam through passivation layer 203 to melt the underlying conductive runners 201.

Thus, the conductive runners may be remelted and planarized so as to fill contact holes/vias, or may be used as redundant runners ( or redundant links). Typically, redundant or spare runners are positioned within the circuit so that, in the case of a defective or faulty runner in the circuit, the redundant runner can be opened by a laser beam to bypass the faulty runner. The characteristics of the passivation layer 203 can thus be varied by varying the ratio of reactants so that the resulting passivation layer 203 has this desired refractive index. However, lowering of the refractive index below 1.7–1.8 may increase the oxygen content of the silicon oxinitride passivation layers 201 which may cause porosity in the layer 201 and thereby degrade its impermeability against impurities.

It will also be appreciated that the silicon oxinitride passivation layers 203 deposited with the above given conditions may have hydrogen incorporated in them, since hydrogen is a constituent of the TEOS and ammonia reactant gases. The presence of hydrogen serves to tie up dangling bonds (unbound valence electrons) on the nonstoichiometric silicon oxinitride layer 203. Thus, the hydrogen neutralizes the surface charge associated with these unbound electrons and thereby increases the dielectric character of the silicon oxinitride layer 203.

As an example of the efficacy of the processes of the preferred embodiment, a silicon wafer having an array of conductive runners, that had a height of approximately 0.7 microns and were separated by approximately 0.5 microns, and an interlevel insulating layer of silicon oxide material that is approximately 6000 Å thick was subjected to the process of the preferred embodiment described above and no keyhole formations were observed in the passivation layer. The wafer with the conductive runners was subjected to a mixture of TEOS at 500 ccm flow, $O_2$ at 50 ccm flow, $NH_3$ at 350 ccm flow, $N_2$ at 4000 ccm flow in a plasma reactor chamber at 4.5 Torr pressure, a temperature of 400° C. and 800 watts of RF power which resulted in a passivation layer that was approximately 6000 Å thick and was very conformal to the upper surface of the interlevel insulating layer.

Thus the invention provides a simple and unique method of fabricating silicon oxinitride passivation layers 203. The plasma deposition can be accurately controlled to achieve required passivating film 203 quality which can be characterized and controlled via the refractive index of the film.

In another embodiment of the present invention, the silicon oxinitride passivation layer deposition can be carried out at reduced pressure in a Low Pressure Chemical Vapor Deposition (LPCVD) reactor by reacting TEOS, ozone ($O_3$), and nitrogen ($N_2$) and either ammonia ($NH_3$) or Diethyl amine. As with the previous embodiment, the process begins with a deposition of an interlevel dielectric 202 over conductive runners 201. This is followed by the LPCVD deposition of silicon oxinitride passivation layer 203. However, it will be noted that the present process uses ozone gas instead of the oxygen gas used in the previously described process. Similar to the first embodiment, a conformal and void-free passivation layer 203 can be formed by adjusting the refractive index of the passivation layer 203 through varying ($NH_3+N_2$)/$O_3$ ratio for constant TEOS flow.

It would be understood that the improved silicon oxinitride deposition techniques provided by these embodiments described above allow for passivation layers 203 having higher conformality land lower defect formation due to the use of TEOS based chemistry. In contrast to the conventional silane based passivation layers, the capability of depositing very conformal passivation layers over closely spaced conductive runners reduces significantly the number of defects and related problems. Additionally, the TEOS based chemistry of the inventive processes eliminates the use of the relatively toxic and flammable silane compound. Therefore, the process is clean and can be economically accomplished using equipment and techniques that are known in the art.

Hence, although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the present invention. Consequently, the scope of the present invention should not be limited to foregoing discussions, but should be defined by the appended claims.

What is claimed:

1. A method of forming a passivation layer on a semiconductor wafer comprising the steps of:
    forming an interlevel insulating layer on a first side of said wafer;
    positioning said wafer in a plasma deposition chamber;
    forming a mixture of a gas containing nitrogen, a gas containing silicon and a gas containing oxygen;
    introducing said mixture into said plasma deposition chamber;
    energizing said mixture of gases to induce said mixture to enter a plasma state and form a passivation layer directly on said interlevel insulating layer in response to said wafer being exposed to the plasma formed from said mixture of gases;
    measuring the refractive index of said passivation layer during said energizing step; and
    adjusting the ratio of nitrogen to oxygen in the gases forming said mixture while said mixture is being introduced into said plasma deposition chamber in response to measuring the refractive index, to control the refractive index of the passivation layer.

2. The method of claim 1, wherein said step of mixing said gases comprises mixing together TEOS, Oxygen ($O_2$), Ammonia ($NH_3$) and Nitrogen ($N_2$).

3. The method of claim 1, wherein said step of mixing said gases comprises mixing together TEOS, Oxygen ($O_2$), Nitrogen ($N_2$) and Diethyl amine.

4. The method of claim 2, wherein said step of energizing the mixture results in a layer of silicon oxynitride ($SiO_xN_y$) being formed on said first side of said wafer.

5. The method of claim 1, wherein said mixing step comprises mixing TEOS having a flow rate of between 100–5000 sccm, Oxygen having a flow rate of between 25–1000 sccm, Ammonia having a flow rate of between 25–1000 sccm, and Nitrogen having a flow rate of between 500–5000 sccm.

6. The method of claim 5, wherein said energizing step comprises applying approximate 100–1000 Watts of RF power to said plasma chamber while said chamber is maintained at a pressure of between 3–9 Torr and at a Temperature between 200–800° C.

7. The method of claim 6, wherein said introducing step is comprised of introducing said gas from a showerhead which forms an upper electrode in said plasma chamber towards a wafer holder that is holding said wafer, wherein said wafer holder forms a lower electrode in said plasma deposition chamber.

8. The method of claim 7, wherein the step of adjusting the ratio between said gases comprises adjusting said ratio to achieve a passivation layer having a refractive index of approximately 1.7–1.8.

9. The method of claim 8, wherein said semiconductor wafer has a plurality of parallel spaced conductive runners positioned thereon and wherein said energizing step results in a passivation layer that is positioned over said parallel spaced conductive runners and, for each conductive runner, said passivation layer at the interface between a side surface of said conductive runner and a top surface of said conductive runner is separated from said passivation layer at the interface between a side surface and a top surface of an adjacent conductive runner.

10. The method of claim 1, wherein said mixing step comprises mixing TEOS, Ozone ($O_3$), Ammonia ($NH_3$) and Nitrogen ($N_2$) and wherein said plasma deposition chamber is a low pressure chemical vapor deposition chamber.

11. The method of claim 1, wherein said mixing step comprises mixing TEOS, Ozone ($O_3$), Nitrogen ($N_2$), and Diethyl amine and wherein said plasma deposition chamber is a low pressure chemical vapor deposition chamber.

12. A method of forming a passivation layer of a silicon wafer comprising the steps of:
    forming an interlevel insulating layer on a first side of said silicon wafer;
    positioning said silicon wafer in a plasma deposition chamber;
    forming a gaseous mixture containing nitrogen, silicon and oxygen;
    introducing said mixture into said plasma deposition chamber; and
    energizing said mixture to induce said mixture to enter a plasma state and form a silicon oxynitride ($SiO_xN_y$) passivation layer directly on said interlevel insulating layer as a result;
    measuring the refractive index of said passivation layer during said energizing step; and
    varying the nitrogen:oxygen ratio in the gaseous mixture while said mixture is being introduced into said plasma deposition chamber to control the refractive index of said passivation layer.

13. The method of claim 12, wherein the step of varying the nitrogen:oxygen ratio comprises varying said ratio so that said passivation layer has a refractive index which is approximately 1.7–1.8.

14. The method of claim 12, wherein said step of mixing said gases comprises mixing together TEOS, Oxygen ($O_2$), Ammonia ($NH_3$) and Nitrogen ($N_2$).

15. The method of claim 12, wherein said step of mixing said gasses comprises mixing together TEOS, Oxygen ($O_2$), Nitrogen ($N_2$) and Diethyl amine.

16. The method of claim 15, wherein said mixing step comprises mixing TEOS having a flow rate of between 100–5000 sccm, Oxygen having a flow rate of between 25–1000 sccm, Ammonia having a flow rate of between 25–1000 sccm, and Nitrogen having a flow rate of between 500–5000 sccm.

17. The method of claim 12, wherein said energizing step comprises applying approximate 100–1000 Watts of RF power to said plasma chamber while said chamber is maintained at a pressure of between 3–9 Torr and at a Temperature between 200°–600° C.

18. The method of claim 14, wherein varying the nitrogen:oxygen ratio comprises varying the ($NH_3+N_2$):$O_2$ ratio.

19. A method of forming a passivation layer directly over an interlevel insulating layer on a silicon wafer comprising:

positioning said wafer in a plasma deposition chamber;

forming a mixture of at least TEOS, Ammonia, Nitrogen and Oxygen in a chamber;

energizing said mixture to a plasma state such that a passivation layer begins to form on said interlevel insulating layer;

monitoring the refractive index of said passivation layer forming on said wafer and adjusting the ratios of Nitrogen to Oxygen to alter said refractive index.

20. The method of claim 19, wherein forming a mixture comprises forming a mixture of at least TEOS, Ammonia, Nitrogen and Oxygen at between 3 and 9 Torr.

21. The method of claim 19, wherein energizing said mixture to a plasma state comprises exposing said mixture to between 100 and 1000 watts of RF power.

* * * * *